United States Patent
Nomachi

(10) Patent No.: US 8,803,123 B2
(45) Date of Patent: Aug. 12, 2014

(54) RESISTANCE CHANGE MEMORY

(71) Applicant: Kabushiki Kaisha Toshiba, Tokyo (JP)

(72) Inventor: Akiko Nomachi, Sapporo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/831,073

(22) Filed: Mar. 14, 2013

(65) Prior Publication Data

US 2013/0334487 A1 Dec. 19, 2013

(30) Foreign Application Priority Data

Jun. 14, 2012 (JP) ................................. 2012-135191

(51) Int. Cl.
*H01L 47/00* (2006.01)

(52) U.S. Cl.
USPC ............. 257/4; 257/2; 257/3; 257/5; 365/148

(58) Field of Classification Search
CPC ...................................................... H01L 45/00
USPC ......................................... 257/2–5; 365/148
See application file for complete search history.

(56) References Cited

U.S. PATENT DOCUMENTS

| | | | |
|---|---|---|---|
| 7,324,365 B2 | 1/2008 | Schwerin et al. | |
| 7,742,330 B2 | 6/2010 | Takemura et al. | |
| 7,875,492 B2 | 1/2011 | Schwerin et al. | |
| 8,116,128 B2 | 2/2012 | Takemura et al. | |
| 8,228,724 B2 | 7/2012 | Takemura et al. | |
| 8,283,650 B2 * | 10/2012 | Breitwisch et al. ............... | 257/4 |
| 8,363,464 B2 | 1/2013 | Takemura et al. | |
| 2005/0270828 A1 | 12/2005 | Motoyoshi | |
| 2011/0031463 A1 * | 2/2011 | Sato et al. ......................... | 257/4 |

FOREIGN PATENT DOCUMENTS

| | | |
|---|---|---|
| JP | 2005-340300 A | 12/2005 |
| JP | 2007-273963 A | 10/2007 |
| WO | WO 2005-117118 A | 12/2005 |

\* cited by examiner

*Primary Examiner* — Matthew W Such
*Assistant Examiner* — Frederick B Hargrove
(74) *Attorney, Agent, or Firm* — Holtz Holtz Goodman & Chick PC

(57) ABSTRACT

According to one embodiment, a resistance change memory includes resistance change elements arrayed with a first space in a first direction and with a second space wider than the first space in a second direction orthogonal to the first direction, second conductive layers disposed on sidewalls of the resistance change elements, each of the second conductive layers having a width greater than or equal to a half of the first space in the first direction and having a width less than a half of the second space in the second direction, the second conductive layers functioning as a first bit line extending in the first direction, a second insulating layer disposed on a sidewall of the first bit line, and not filling the second space, and a third conductive layer functioning as a second bit line extending in the first direction by filling the second space.

20 Claims, 18 Drawing Sheets

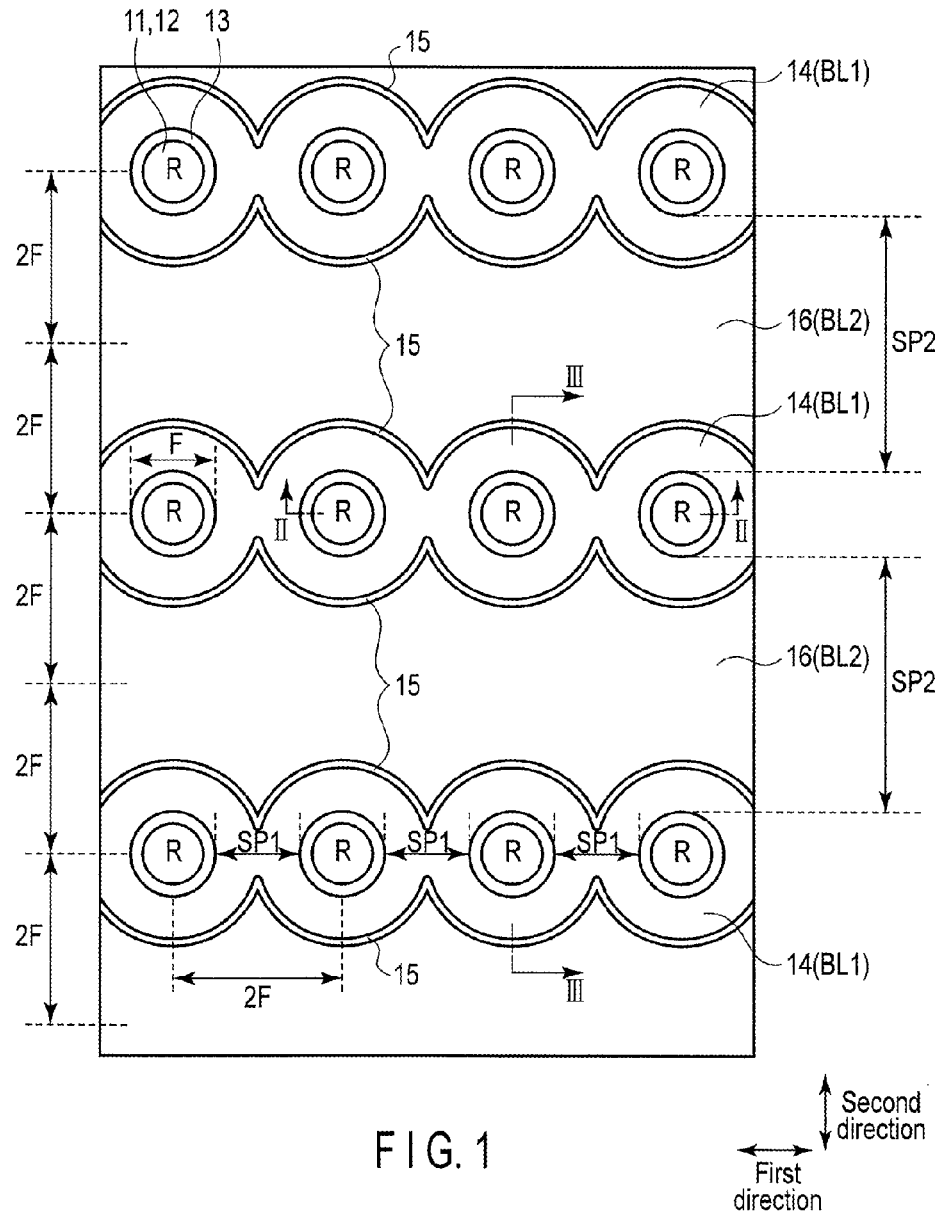
F I G. 1

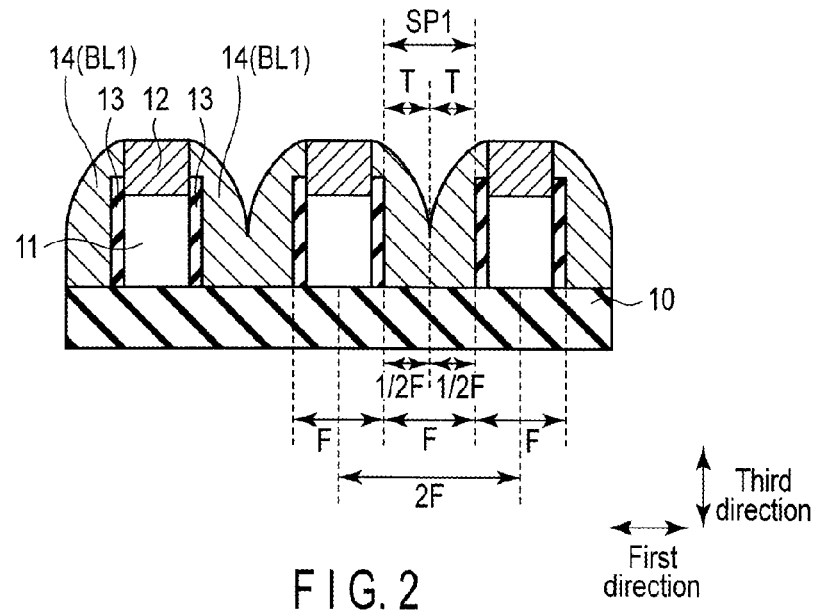
F I G. 2
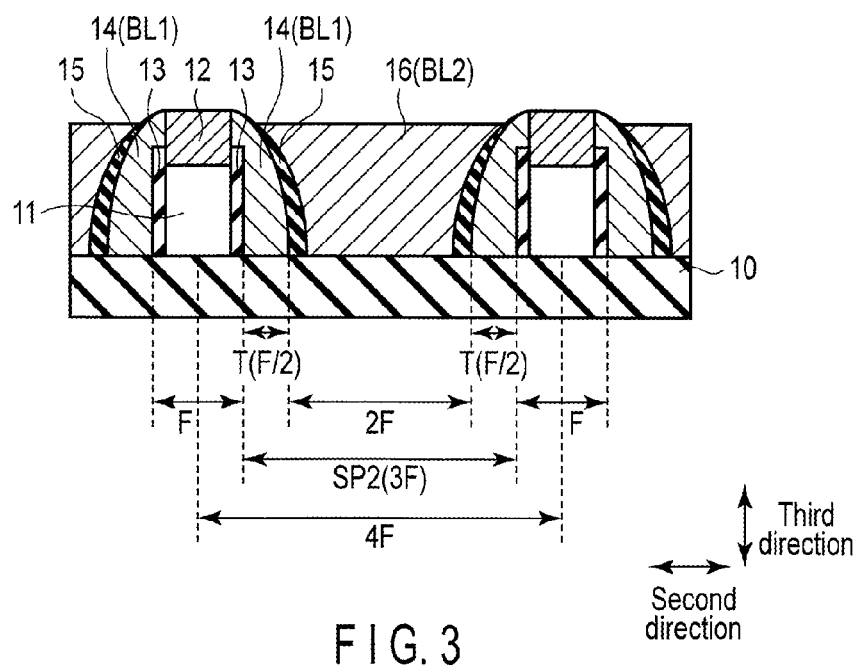
F I G. 3

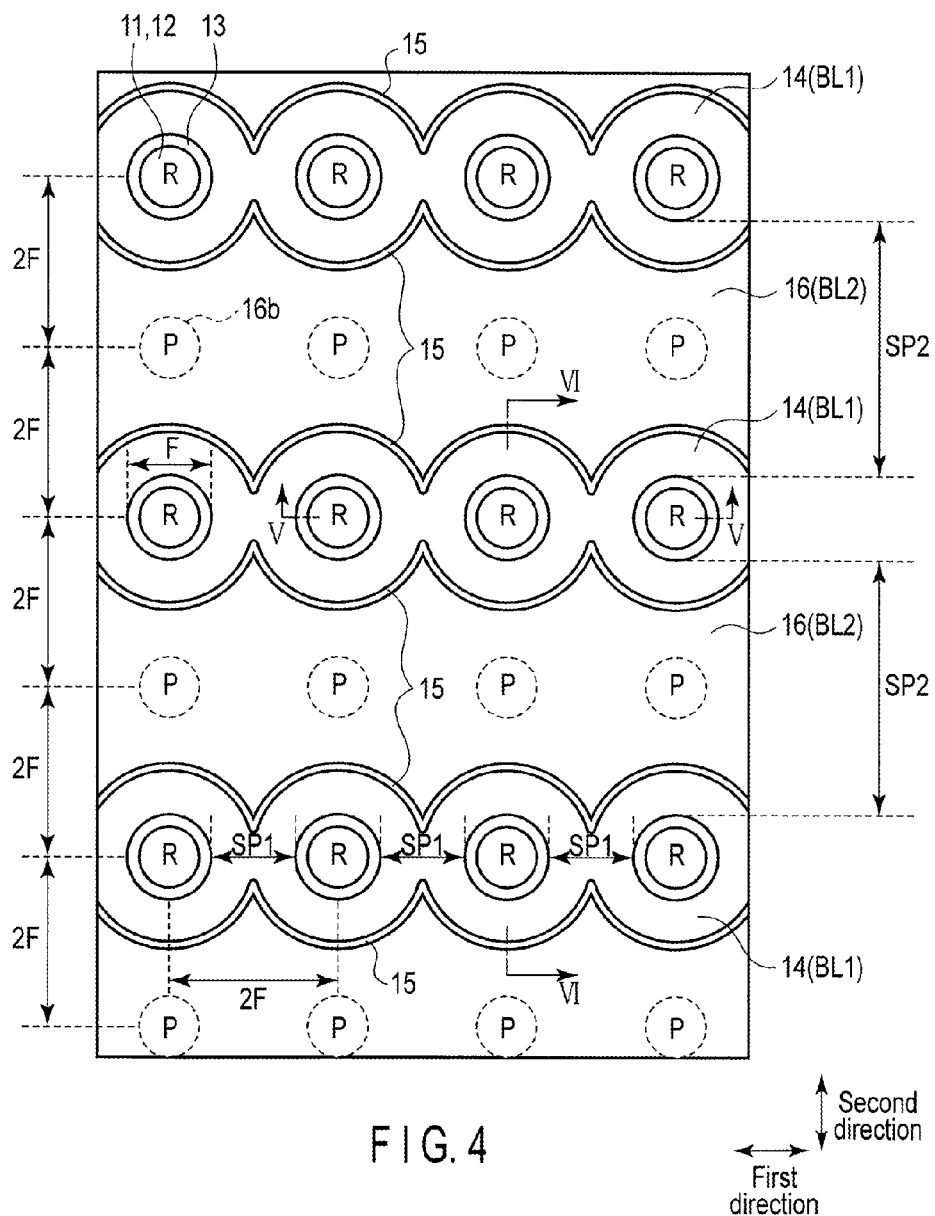
F I G. 4

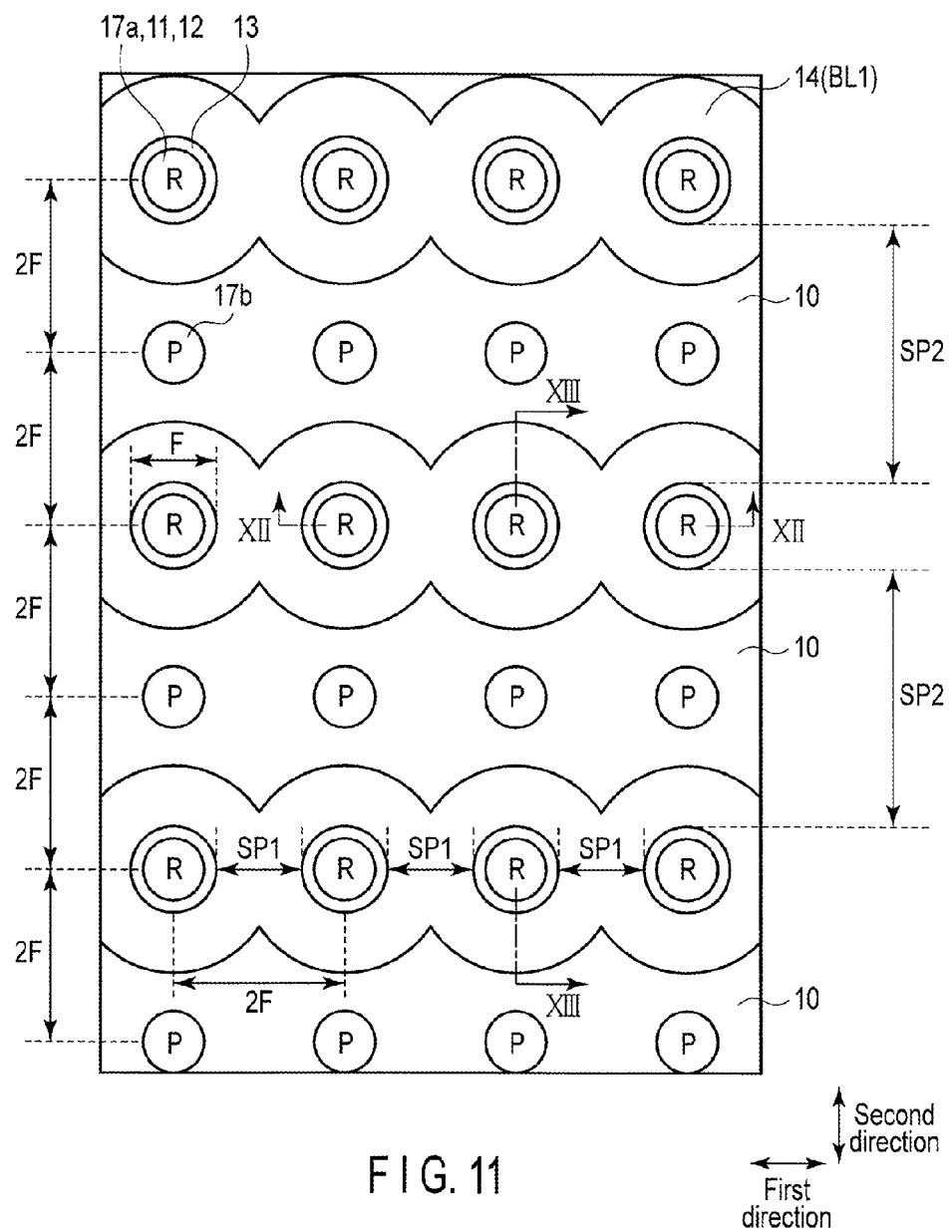
F I G. 11

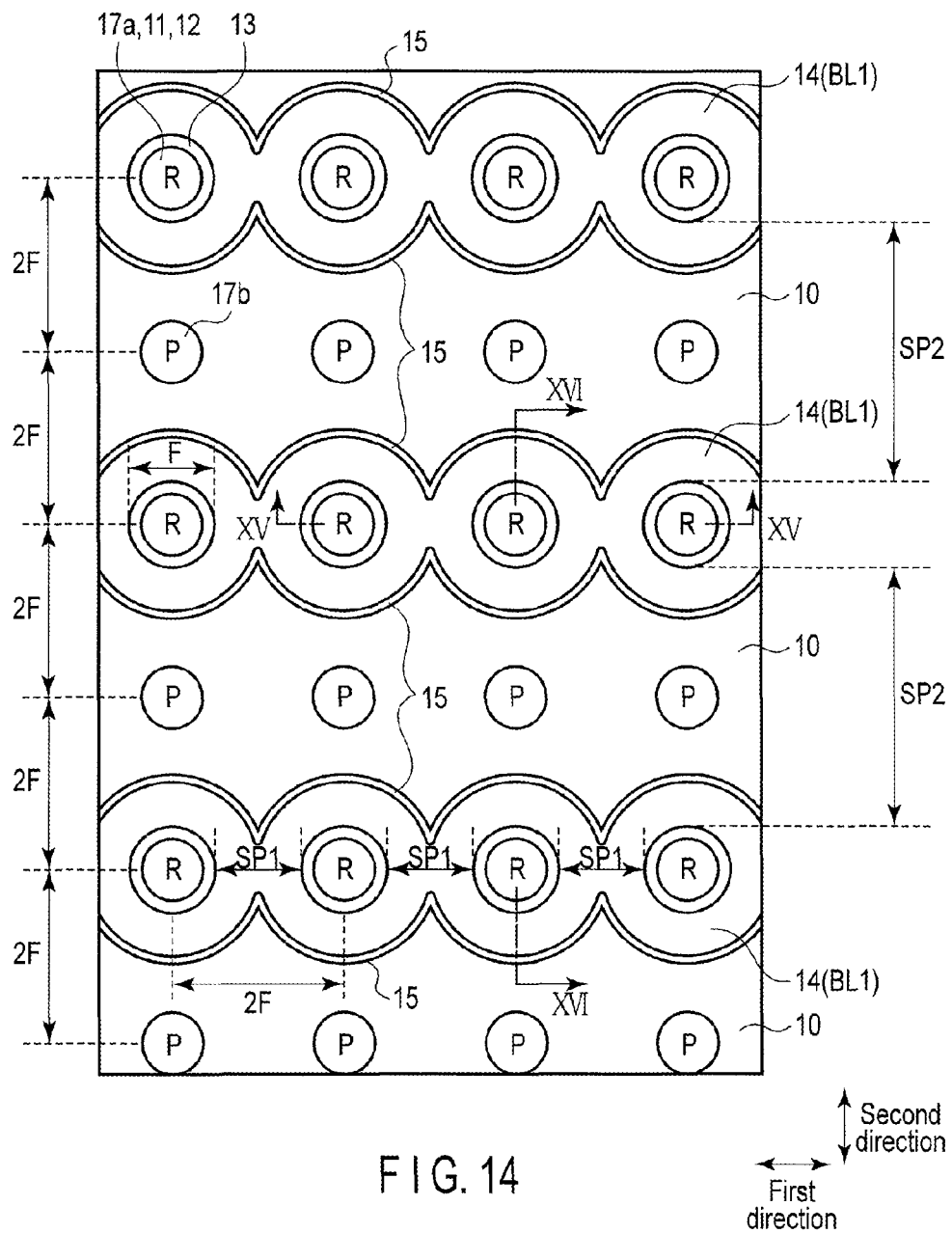
F I G. 14

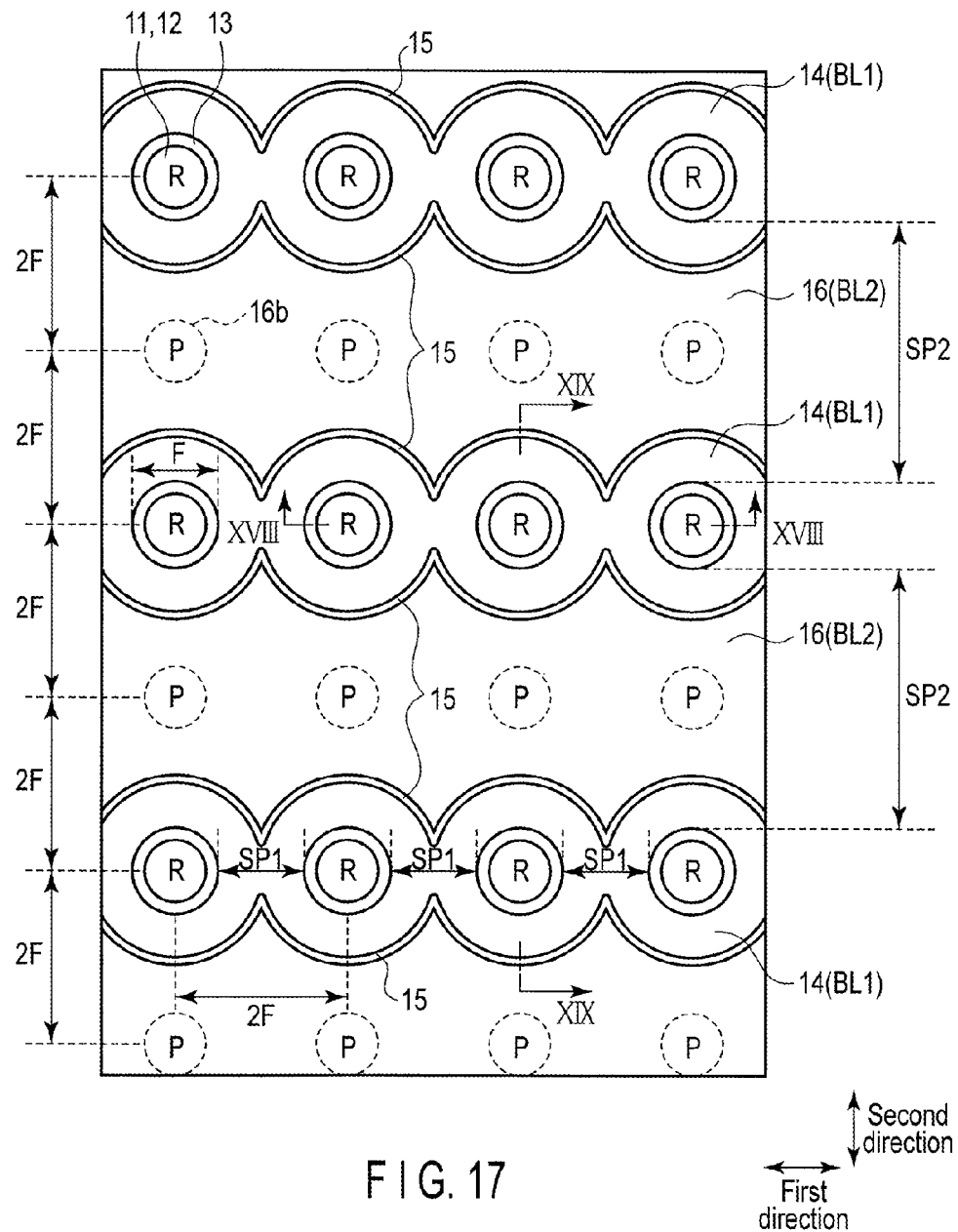
F I G. 17

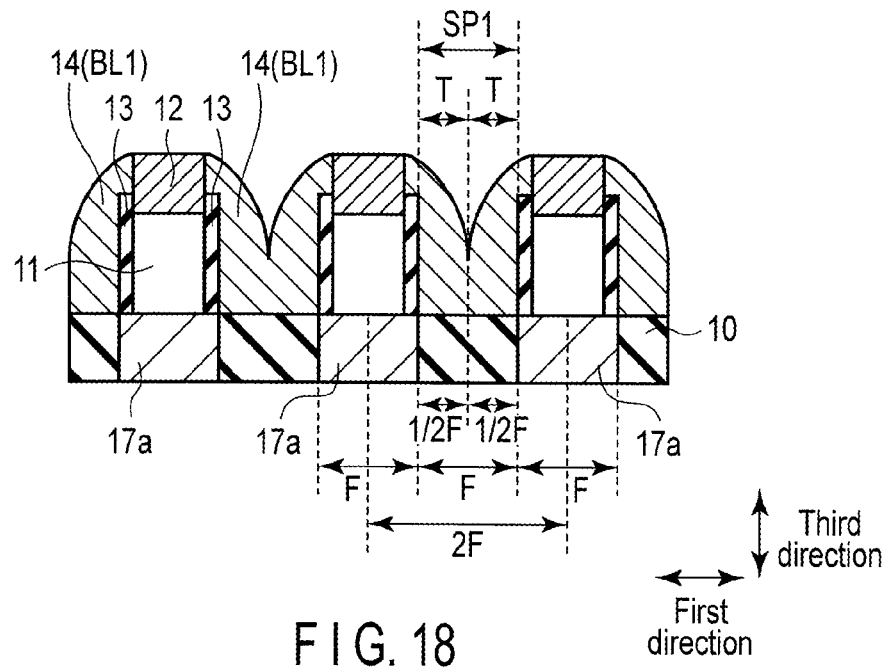
F I G. 18
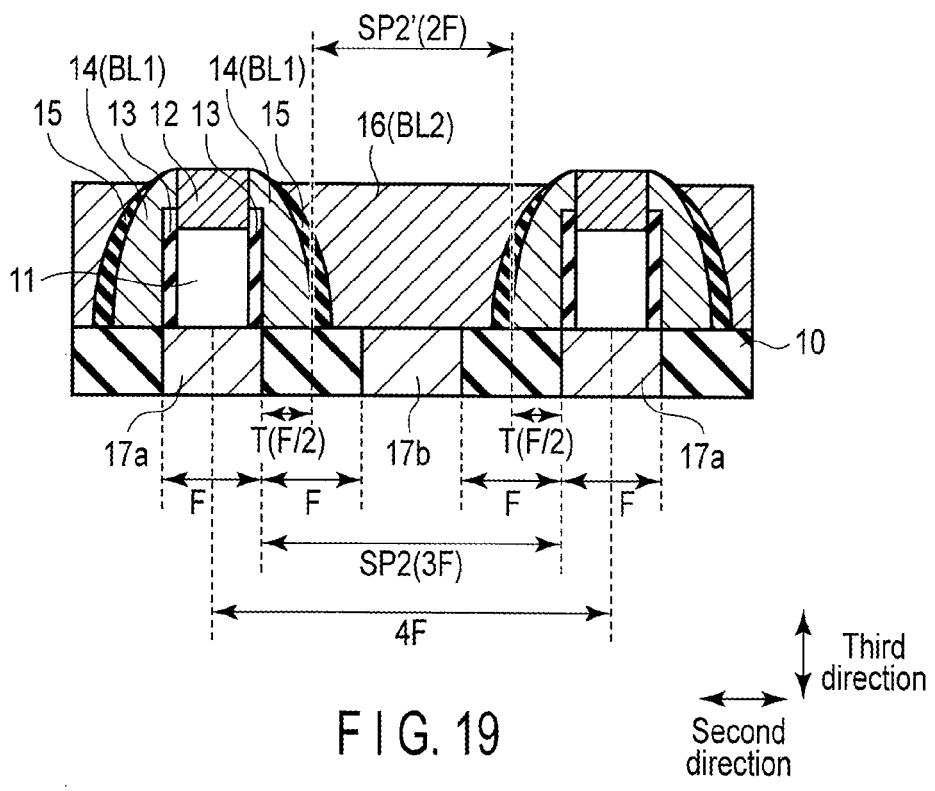
F I G. 19

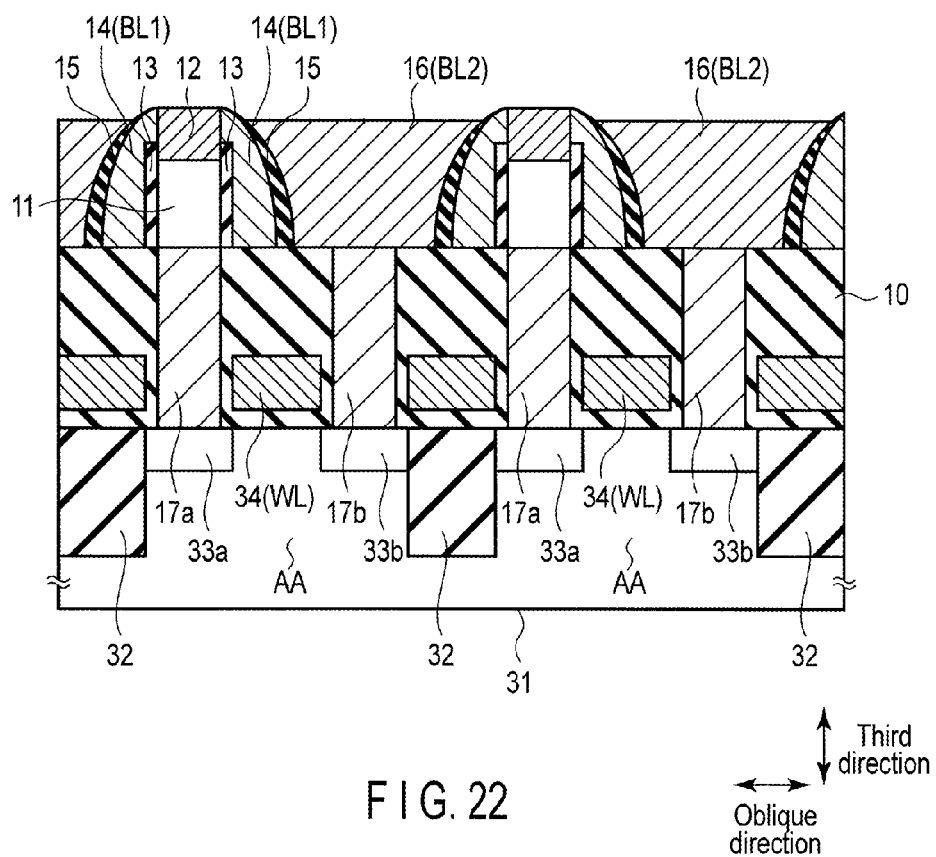
F I G. 22

US 8,803,123 B2

RESISTANCE CHANGE MEMORY

CROSS-REFERENCE TO RELATED APPLICATIONS

This application is based upon and claims the benefit of priority from Japanese Patent Application No. 2012-135191, filed Jun. 14, 2012, the entire contents of which are incorporated herein by reference.

FIELD

Embodiments described herein relate generally to a resistance change memory.

BACKGROUND

Microfabrication of a memory cell and reduction of a manufacturing cost are required in a resistance change memory including a resistance change element in which a resistance value changes according to a current, a voltage, heat and a magnetic field. However, in the resistance change memory, for example, in order to read and write data, one memory cell includes one resistance change element and one selection transistor, and two bit lines are connected to one memory cell. In this case, a size per memory cell is hardly formed smaller than a constant value, and a lithography process is required to form the bit line and a via.

BRIEF DESCRIPTION OF THE DRAWINGS

FIG. 1 is a plan view illustrating a first structure example;
FIG. 2 is a sectional view along line II-II in FIG. 1;
FIG. 3 is a sectional view along line III-III in FIG. 1;
FIG. 4 is a plan view illustrating a second structure example;
FIG. 11 is a plan view illustrating a manufacturing method;
FIG. 14 is a plan view illustrating a manufacturing method;
FIG. 17 is a plan view illustrating a manufacturing method;
FIG. 18 is a sectional view along line XVIII-XVIII in FIG. 17;
FIG. 19 is a sectional view along line XIX-XIX in FIG. 17;
FIG. 22 is a sectional view along line XXII-XXII in FIG. 21.

DETAILED DESCRIPTION

Figure 5:
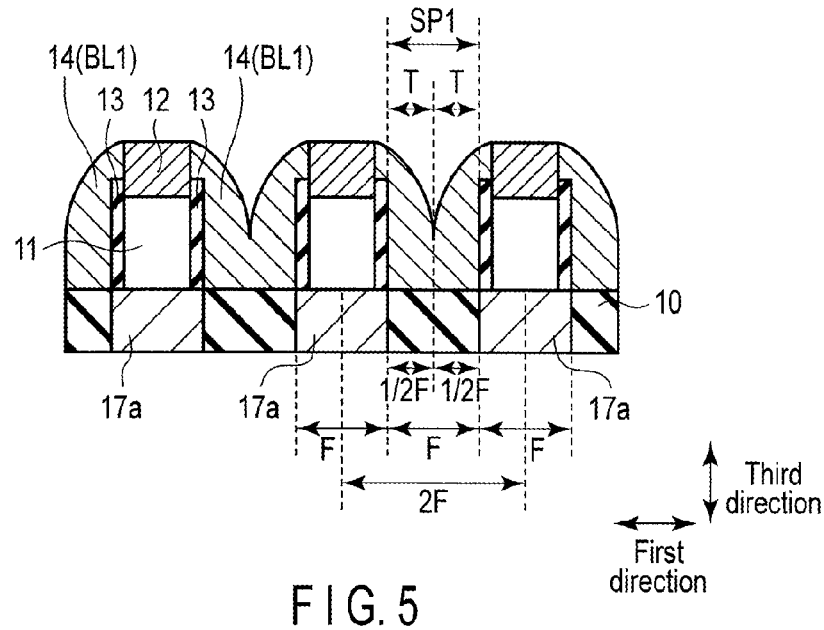
FIG. 5 is a sectional view along line V-V in FIG. 4.

In general, according to one embodiment, a resistance change memory includes: resistance change elements arrayed with a first space in a first direction and with a second space wider than the first space in a second direction orthogonal to the first direction, each of the resistance change elements including a variable resistance layer, a first conductive layer on the variable resistance layer, and a first insulating layer covering a sidewall of at least the variable resistance layer; second conductive layers disposed on sidewalls of the first insulating layer and the first conductive layer of resistance change elements respectively, each of the second conductive layers having a width greater than or equal to a half of the first space in the first direction and having a width less than a half of the second space in the second direction, the second conductive layers functioning as a first bit line extending in the first direction by connecting the resistance change elements arrayed in the first direction; a second insulating layer disposed on a sidewall of the first bit line, and not filling the second space; and a third conductive layer functioning as a second bit line extending in the first direction by filling the second space.

Hereinafter, an embodiment of the invention will be described with reference to the drawings.

In a process of manufacturing the resistance change memory, generally the via disposed in the same layer as the resistance change element and the bit lines disposed above the via and the resistance change element are formed by the lithography process. However, as described above, in this case, the size per memory cell is hardly formed smaller than the constant value, and the manufacturing cost increases by increasing the number of lithography processes.

Therefore, in the following embodiment, there is proposed a technology in which the microfabrication of the memory cell and the reduction of the manufacturing cost are achieved by forming the bit line in a self-aligned manner with respect to the resistance change element irrespective of the lithography process.

Specifically, using a sidewall process technology, a sidewall conductive layer is formed as the bit line on sidewalls of resistance change elements arrayed with a first pitch in a first direction. In this case, a width in the first direction of the sidewall conductive layer is controlled at a constant value or more in order that the sidewall conductive layer acts as the bit line.

For example, in the case of a 1T1R-type cell structure in which one memory cell includes one resistance change element and one selection transistor, first and second bit lines are connected to the one memory cell. The first bit line is formed in the self-aligned manner with respect to the resistance change element by the sidewall process technology.

The second bit line is formed in a space formed in the self-aligned manner between the first bit lines such that a pitch in a second direction orthogonal to the first direction of the arrayed the resistance change elements is wider than the pitch in the first direction. That is, for example, the second bit line is formed in the self-aligned manner with respect to the first bit line using a burying technology, such as a damascene technology.

As used herein, the resistance change element means an element in which the resistance value changes according to the current, the voltage, the heat, the magnetic field, and the like. The variable resistance memory is a semiconductor memory in which the resistance change element is used as the memory cell. Examples of the variable resistance memory include an MRAM (Magnetic Random Access Memory) in which a magnetoresistive element is used as the memory cell and a ReRAM (Resistive Random Access Memory) in which metal oxide is used as the memory cell.

First Structure Example

FIG. 1 illustrates a first structure example of the resistance change memory. FIG. 2 is a sectional view along line II-II in FIG. 1, and FIG. 3 is a sectional view along line III-III in FIG. 1.

The first structure example relates to structure of a bit line BL1 and a bit line BL2, in which the size per memory cell can be reduced than ever before in the case that resistance change elements R are arrayed with a pitch P1 in the first direction and arrayed with a pitch P2 wider than the pitch P1 in a second direction orthogonal to the first direction.

For the first structure example, various modifications can be made in the underlayer structure of the resistance change elements R, for example, a layout of a memory cell array including a switch elements (FET: Field Effect Transistor) connected to the resistance change element R and word lines. Therefore, in the first structure example, only the resistance change element R and bit lines BL1 and BL2 are described below.

The layout of the memory cell array including the switch element and the word line is described in application examples.

For example, an underlayer 10 is an insulating layer or a semiconductor layer. When the underlayer 10 is the insulating layer, a contact plug (a conductive layer) may be provided in the underlayer 10 immediately below the resistance change element R.

The resistance change elements R are arrayed on the underlayer 10.

Each of the resistance change elements R includes a variable resistance layer 11, a first conductive layer 12 on the variable resistance layer 11, and a first insulating layer 13 that covers a sidewall of the variable resistance layer 11. For example, the first conductive layer 12 acts as a hard mask layer when the variable resistance layer 11 is patterned. For example, the first insulating layer 13 acts as a protective layer that protects the variable resistance layer 11.

When the first insulating layer 13 acts as the protective layer, it is necessary for the first insulating layer 13 to cover at least the sidewall of the variable resistance layer 11. Therefore, for example, the oxidation of the sidewall of the variable resistance layer 11 can be prevented.

In the first structure example, an end portion located in a third direction (a direction perpendicular to an upper surface of the underlayer 10) orthogonal to the first and second directions of the first insulating layer 13 exists between a lower surface and an upper surface of the first conductive layer 12. Desirably the sidewall of the first conductive layer 12 is not covered with the first insulating layer 13 as much as possible. This is because a contact resistance between the first conductive layer 12 and the second conductive layer 14 can be decreased with increasing contact area between the two.

The resistance change elements R are disposed in the first direction with a first space SP1, and disposed in the second direction with a second space SP2 wider than the first space SP1.

For example, assuming that F is a reference value, the resistance change elements R are disposed in the first direction with a pitch 2F, and disposed in the second direction with a pitch 4F. For example, each of the resistance change elements R has a cylindrical shape having a diameter (a size) of F (the reference value).

F is the reference value that is used to determine the layout of an LSI in design. Although F is not particularly fixed, F means a minimum dimension (a feature size or a half pitch of line and space) that can be formed by photolithography.

In this case, for example, the first space SP1 is equal to F, and the second space SP2 is equal to 3F.

A second conductive layer 14 is a sidewall conductive layer, and is disposed on the sidewalls of the first insulating layer 13 and the first conductive layer 12.

Because a width T in the first direction of the second conductive layer 14 is greater than or equal to a half of the first space SP1 (for example, at least F/2), in the second conductive layer 14, the resistance change elements R arrayed in the first direction are connected to each other to construct the first bit line BL1 extending in the first direction.

The first bit line BL1 is constructed by the sidewall conductive layer. Therefore, as is clear from FIG. 1, a side surface of the first bit line BL1 has the layout in which convex curved surfaces is connected.

On the other hand, because the width T in the second direction of the second conductive layer 14 is less than a half of the second space SP2 (for example, less than 3F/2), in the second conductive layer 14, the resistance change elements R arrayed in the second direction are not connected to each other.

For example, assuming that second conductive layer 14 is formed with an even thickness T around the resistance change element R, the width T in the second direction of the second conductive layer 14 is set to a range of $F/2 \leq T < 3F/2$.

A second insulating layer 15 is a sidewall insulating layer, and is disposed on the sidewall of the second conductive layer 14. Because the second insulating layer 15 is provided to electrically insulate the first bit line BL1 from the second bit line BL2, it is necessary for the second insulating layer 15 to have the sufficient thickness.

In the second insulating layer 15, because the second bit line BL2 is disposed between the first bit lines BL1, it is necessary that the second space SP2 be not filled with the second insulating layer 15. The second space SP2 is filled with a third conductive layer 16 to construct the second bit line BL2 extending in the first direction. That is, the third conductive layer 16 has a damascene structure.

The second bit line BL2 is located in the second space SP2 between the first bit lines BL1. Therefore, as is clear from FIG. 1, the side surface of the second bit line BL2 has the layout in which concave curved surfaces is connected.

As can be seen from FIGS. 1 and 2, the widths in the second direction of the first and second bit lines BL1 and BL2 vary according to a position. Desirably, in order to equalize wiring resistances of the first and second bit lines BL1 and BL2, an average width in the second direction of the second bit line BL2 is substantially equal to double (2T) the width T in the second direction of the second conductive layer (the sidewall conductive layer) constructing the first bit line BL1.

According to the first structure example, the first bit line BL1 is constructed by the second conductive layer (sidewall conductive layer) 14, and the second bit line BL2 is constructed by the third conductive layer (damascene structure) 16. Therefore, it is not necessary that the first bit line BL1 and the second bit line BL2 be formed by the lithography process. Additionally, the via is also eliminated, so that the reduction of the manufacturing cost can be achieved. The reduction of the manufacturing cost is described in the manufacturing method.

According to the first structure example, the width and distance of the first and second bit lines BL1, BL2 can be set to a value smaller than the reference value F (for example, the minimum dimension that can be formed by the photolithography).

Second Structure Example

Figure 6:
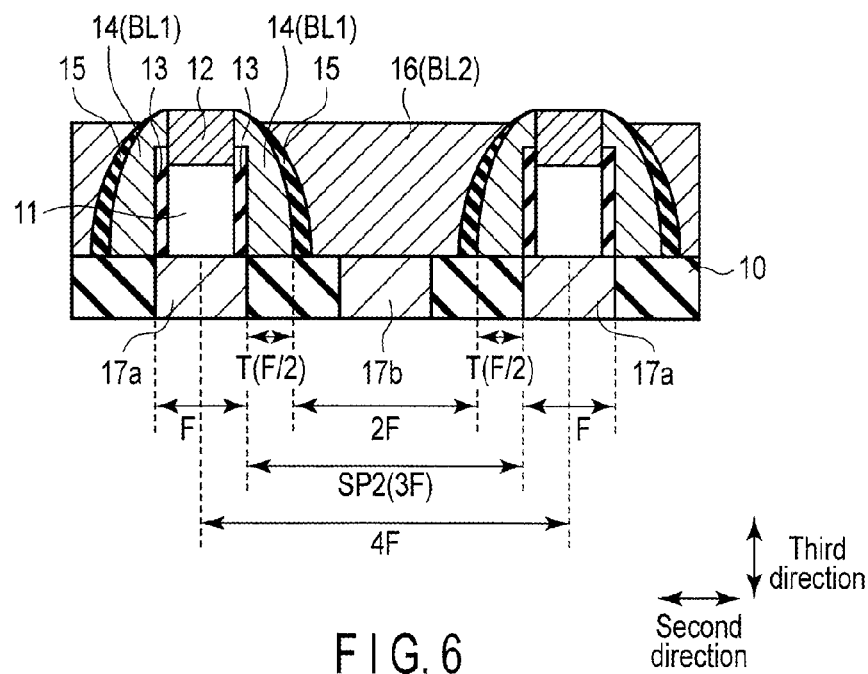
FIG. 6 is a sectional view along line VI-VI in FIG. 4.

FIG. 4 illustrates a second structure example of the resistance change memory. FIG. 5 is a sectional view along line V-V in FIG. 4, and FIG. 6 is a sectional view along line VI-VI in FIG. 4.

The second structure example is a modification of the first structure example.

The second structure example differs from the first structure example in that contact plugs 17a and 17b disposed with a constant pitch in the first direction is provided in a second space SP2. Because the second structure example is identical to the first structure example in other points, the detailed description of the second structure example is omitted.

In the second structure example, an underlayer 10 is the insulating layer.

The contact plugs 17a and 17b are disposed in the underlayer 10. The contact plug 17a is disposed immediately below a variable resistance layer 11 of a resistance change element R, and electrically connected to the variable resistance layer 11. The contact plug 17b is disposed immediately below a second bit line BL2, and electrically connected to the second bit line BL2.

Like the resistance change element R, for example, the contact plugs 17a are disposed in the first direction with the pitch 2F, and disposed in the second direction with the pitch 4F.

For example, the contact plugs 17b are disposed in the first direction with the pitch 2F, and disposed in the second direction with the pitch 4F. However, the contact plugs 17b are disposed in the second space SP2.

In the second structure example, the width T in the second direction of a second conductive layer 14 is determined on the condition that the second conductive layer 14 is not in contact with the contact plug 17b.

For example, in the first structure example, the width T is set to the range of $F/2 \leq T < 3F/2$. On the other hand, in the second structure example, an upper limit of the width T is restricted to the size of the contact plug 17b. For example, assuming that F is the size of the contact plug 17b, the width T of the second conductive layer 14 is set to a range of $F/2 \leq T < F$.

In the second structure example, like the first structure example, the microfabrication of the memory cell and the reduction of the manufacturing cost can effectively be obtained.

For example, in principle, when the width T of the second conductive layer (sidewall conductive layer) 14 is set to a minimum value (for example, F/2), the pitch in the second direction of the resistance change elements R is smaller than 4F.

Figure 7:
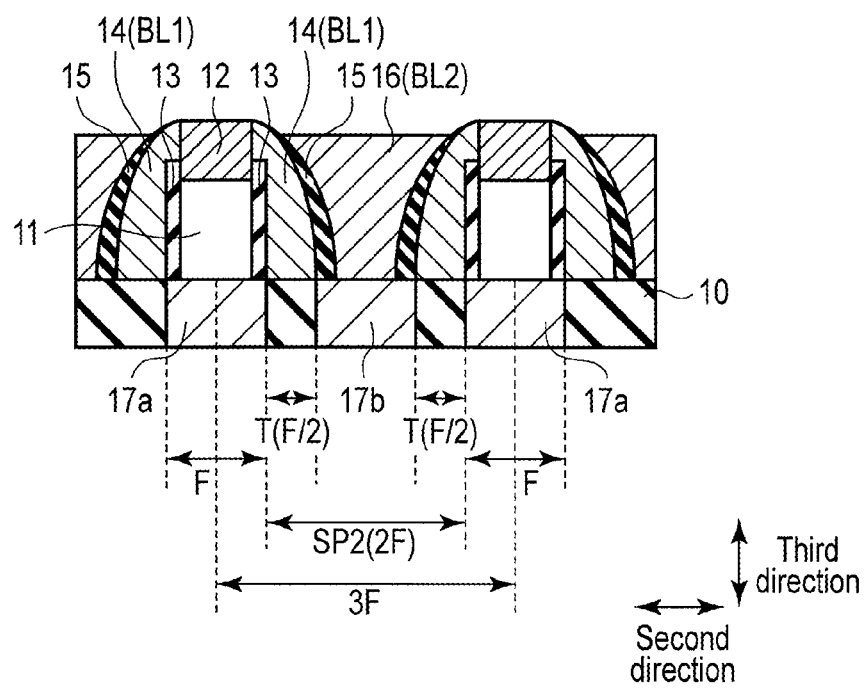
FIG. 7 is a sectional view illustrating an effect related to reduction of a bit-line distance.

For example, as illustrated in FIG. 7, when the width T of the second conductive layer (sidewall conductive layer) 14 is set to a minimum value (for example, F/2), the pitch in the second direction of the resistance change elements R can maximally be reduced to a value close to 3F without limit. This means contribution to the microfabrication (the reduction of the size per memory cell) of the memory cell.

However, in the second structure example, it is necessary to insulate the first bit line BL1 from the contact plug 17b and to connect the second bit line BL2 with the contact plug 17b. Therefore, the pitch in the second direction of the resistance change elements R is greater than 3F, and is set to a range of 4F or less.

Modifications

In the first and second structure examples, the first insulating layer 13 and the second insulating layer 15 may include a single layer or layers.

The first conductive layer 12, the second conductive layer 14, and the third conductive layer 16 may include the single layer or the plurality of layers.

The planar shape of the resistance change element R is circular. However, the resistance change element R is not limited to the circular shape. The planar shape of the resistance change element R may be square or ellipsoidal. When the planar shape of the resistance change element R is square, for example, the reference value (the size) F is a length of a short side. When the planar shape of the resistance change element R is ellipsoidal, for example, the reference value (the size) F is a length of a short axis.

Material Examples

For example, the first insulating layer 13 and the second insulating layer 15 include one of silicon nitride, boron nitride, aluminum nitride, silicon oxide, aluminum oxide, magnesium oxide, hafnium oxide, lanthanum oxide, zirconium oxide, and yttrium oxide.

The first insulating layer 13 and the second insulating layer 15 may be made of the same material or different materials.

Desirably the first insulating layer 13 includes a material having an excellent function of protecting the resistance change element R, for example, a material having an excellent function of preventing the oxidation of the resistance change element R.

For example, the first conductive layer 12 includes metals, such as tantalum and tungsten, or conductive compounds, such as titanium nitride and tantalum nitride. For example, the second conductive layer 14 and the third conductive layer 16 include metals, such as copper and aluminum. The second conductive layer 14 and the third conductive layer 16 may be made of the same material or different materials.

For example, the contact plugs 17a and 17b include one of tungsten, titanium, titanium nitride, copper, tantalum, and tantalum nitride.

[Manufacturing Method]

The method for manufacturing the resistance change memory of the first and second structure examples will be described.

Because the first and second structure examples differ from each other in that the contact plug is provided in the underlayer, the method for manufacturing the resistance change memory of the second structure example in which the contact plug is provided in the underlayer will be described below. The method for manufacturing the resistance change memory of the first structure example can easily be obtained when a step of forming the contact plug is eliminated from the following manufacturing method contact plug.

FIGS. 8 to 19 illustrate the method for manufacturing the second structure example.

Figure 8:
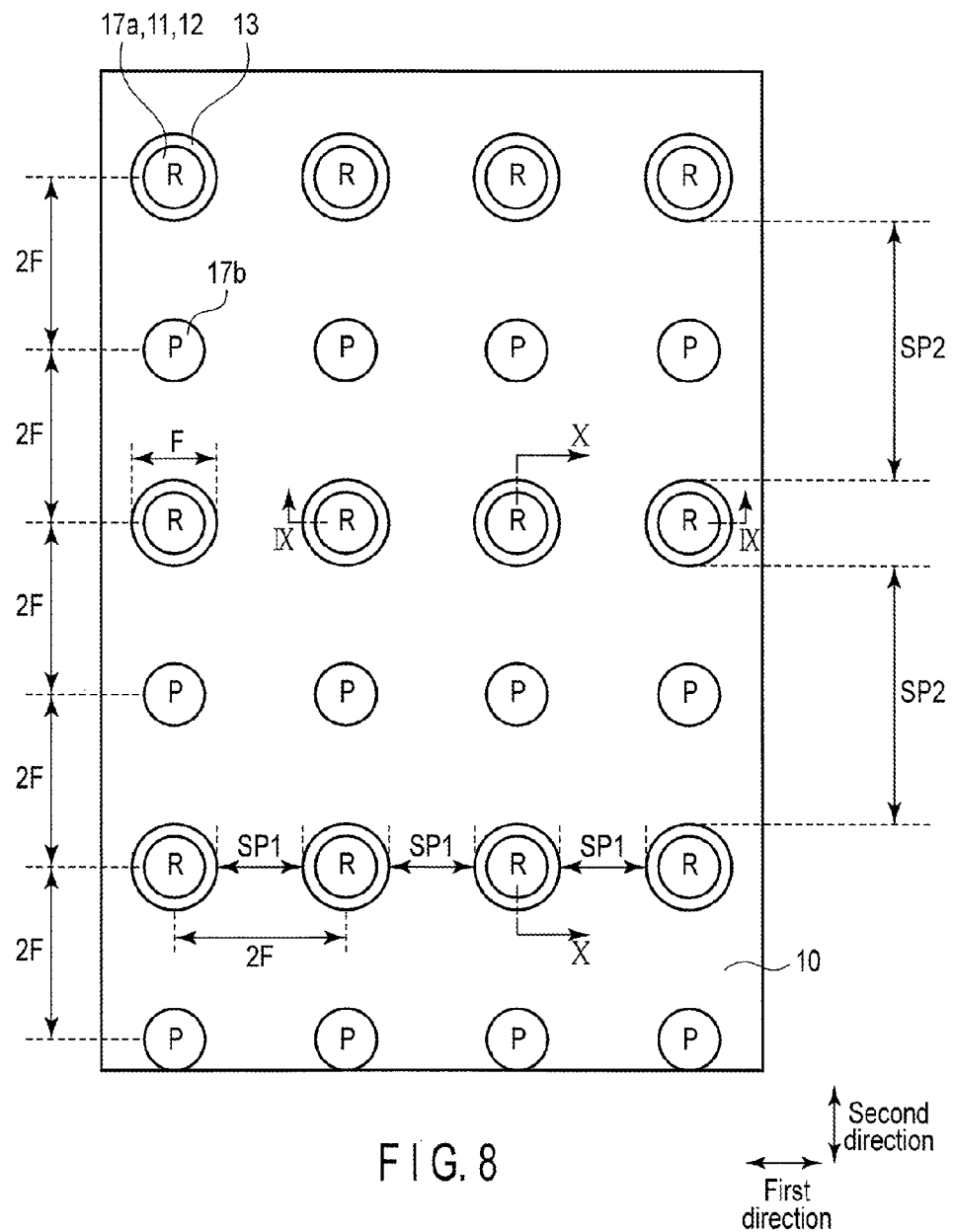
FIG. 8 is a plan view illustrating a manufacturing method.
Figure 9:
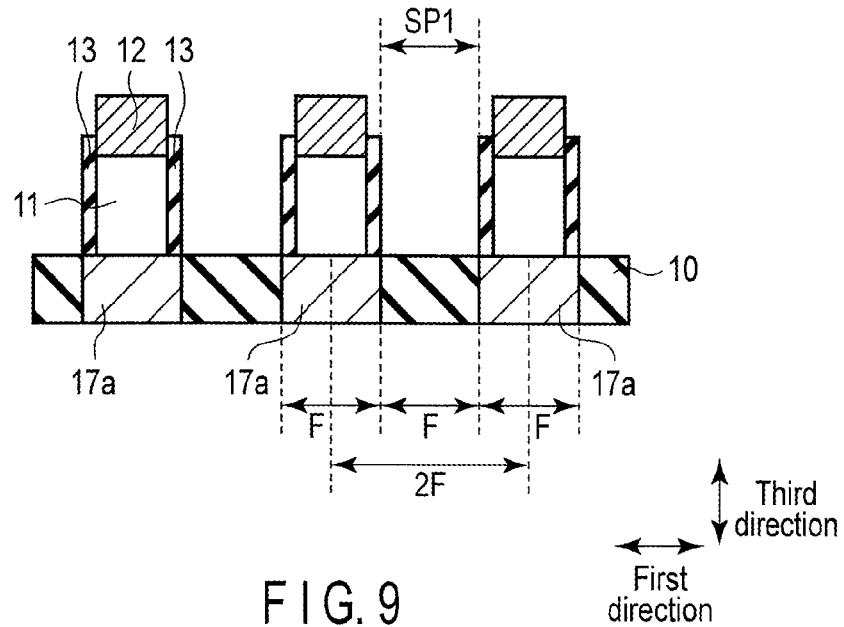
FIG. 9 is a sectional view along line IX-IX in FIG. 8.
Figure 10:
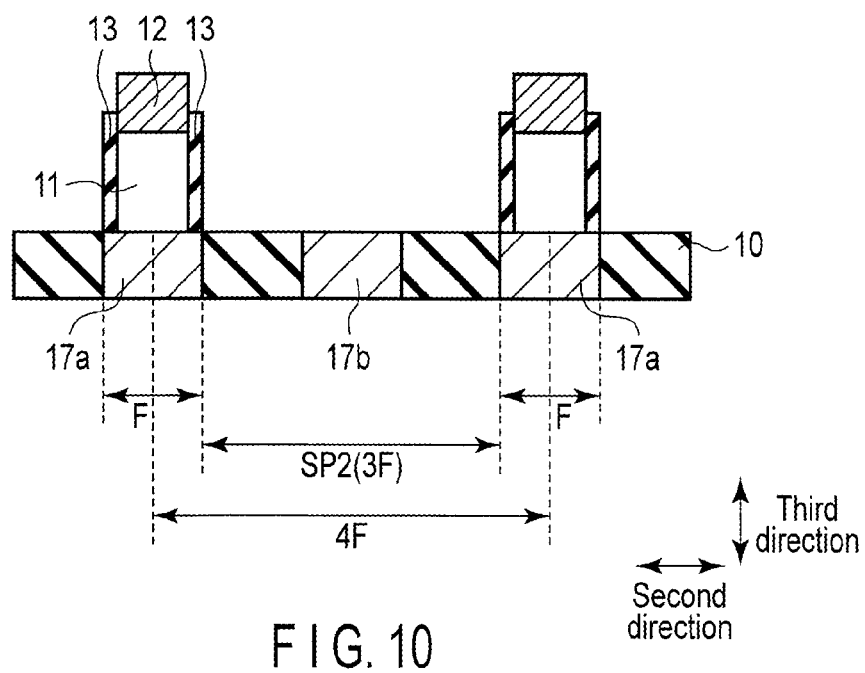
FIG. 10 is a sectional view along line X-X in FIG. 8.

As illustrated in FIGS. 8 to 10, the contact plugs 17a and 17b are formed in the underlayer 10. For example, the contact plugs 17a and 17b can be formed by the damascene process. That is, after the holes are made in the underlayer 10, the contact plugs 17a and 17b are formed by filling the holes with the conductive layers by, for example, a CVD method or a CMP method.

The contact plugs 17a and 17b are collectively disposed with the pitch 2F in the first direction, and collectively disposed with the pitch 2F in the second direction.

Then the resistance change elements R are formed on the contact plug 17a.

In the second structure example, each of the resistance change elements R includes the variable resistance layer 11, the first conductive layer 12 on the variable resistance layer 11, and the first insulating layer 13 that covers the sidewall of the resistance change element R. Accordingly, first, the variable resistance layer 11 and the first conductive layer 12 are formed on the underlayer 10 by methods, such as a CVD method, a PVD method, and an ALD method.

After a resist pattern is formed on the first conductive layer 12 by a lithography process, the first conductive layer 12 is patterned by RIE with the resist pattern as a mask. The resist pattern is removed, and the variable resistance layer 11 is patterned by methods, such as IBE and RIE, with the first conductive layer 12 as a hard mask.

Therefore, the resistance change elements R can be formed.

In the second structure example, the resistance change elements R have the size of the reference value F. The resistance change elements R are arrayed with the pitch 2F in the first direction and with the pitch 4F in the second direction. That is, the resistance change elements R are disposed with the first space SP1 in the first direction, and disposed with the second space SP2 in the second direction.

For example, the first space SP1 is equal to the reference value F, and the second space SP2 is equal to triple (3F) the reference value F.

Then the first insulating layer 13 is formed as the sidewall insulating layer on the sidewall of at least the variable resistance layer 11. The first insulating layer 13 that covers the variable resistance layer 11 and the first conductive layer 12 is formed by methods, such as the CVD method, the PVD method, and the ALD method. The first insulating layer 13 is etched by the RIE to leave the first insulating layer 13 only on the sidewall of the variable resistance layer 11.

At this point, the etching of the first insulating layer 13 is controlled such that the end portion located in the third direction (the direction perpendicular to the upper surface of the underlayer 10) of the first insulating layer 13 exists between the lower surface and the upper surface of the first conductive layer 12 after the etching.

Figure 12:
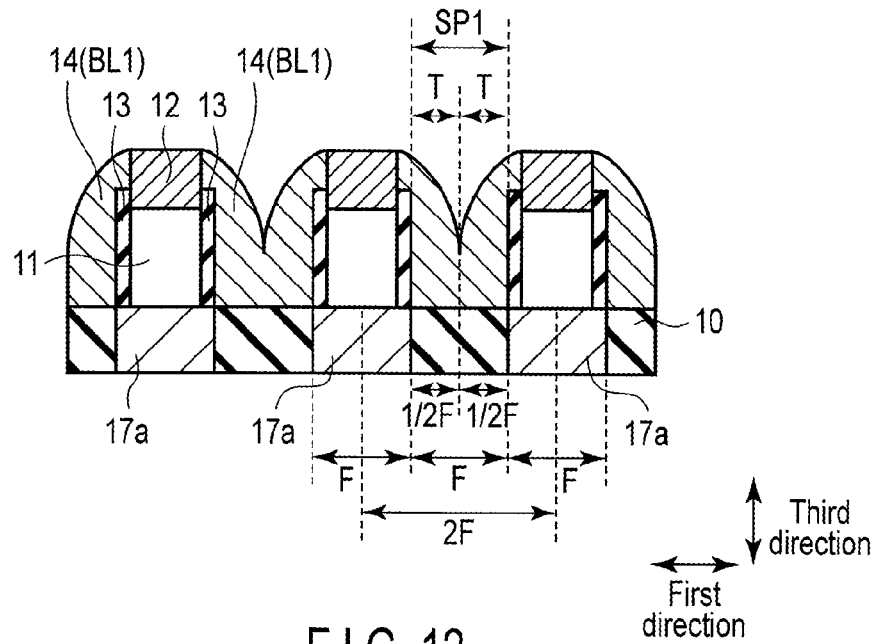
FIG. 12 is a sectional view along line XII-XII in FIG. 11.
Figure 13:
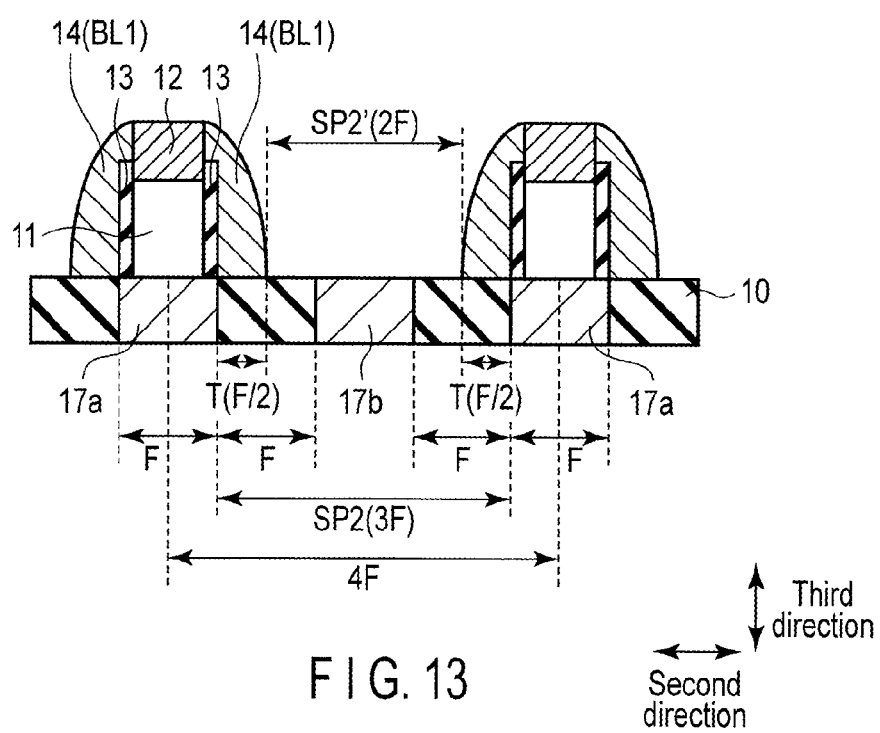
FIG. 13 is a sectional view along line XIII-XIII in FIG. 11.

Then, as illustrated in FIGS. 11 to 13, the second conductive layer 14 is formed as the sidewall conductive layer on the sidewalls of the first insulating layer 13 and the first conductive layer 12, whereby the first bit line BL1 is formed in the self-aligned manner with respect to the resistance change elements R.

The second conductive layer 14 that covers the resistance change elements R is formed by methods, such as the CVD method, the PVD method, and the ALD method. The second conductive layer 14 is etched by the RIE to leave the second conductive layer 14 only on the sidewall of the resistance change element R.

At this point, for example, the thickness T of the second conductive layer 14 in the direction (the first and second directions) perpendicular to the sidewall of the resistance change element R is set greater than or equal to a half of the first space SP1 and less than a half of the second space SP2. Therefore, the first space SP1 is filled with the second conductive layer 14, and the second conductive layer 14 connects the resistance change elements R arrayed in the first direction, and constructs the first bit line BL1 extending in the first direction.

Because the second space SP2 is not filled with the second conductive layer 14, the second space SP2 is still ensured between the first bit line BL1. However, for example, assuming that F/2 is the thickness T in the first and second directions of the second conductive layer 14, a width SP2' in the second direction of the second space SP2 is reduced to 2F (=3F−F) after the second conductive layer 14 is formed.

In the second structure example, for example, as illustrated in FIG. 12, a recess is formed on the upper surface of the second conductive layer 14 on the first space SP1. However, the upper surface of the second conductive layer 14 can substantially be formed flat on the first space SP1 by controlling the thickness T of the second conductive layer 14.

Figure 15:
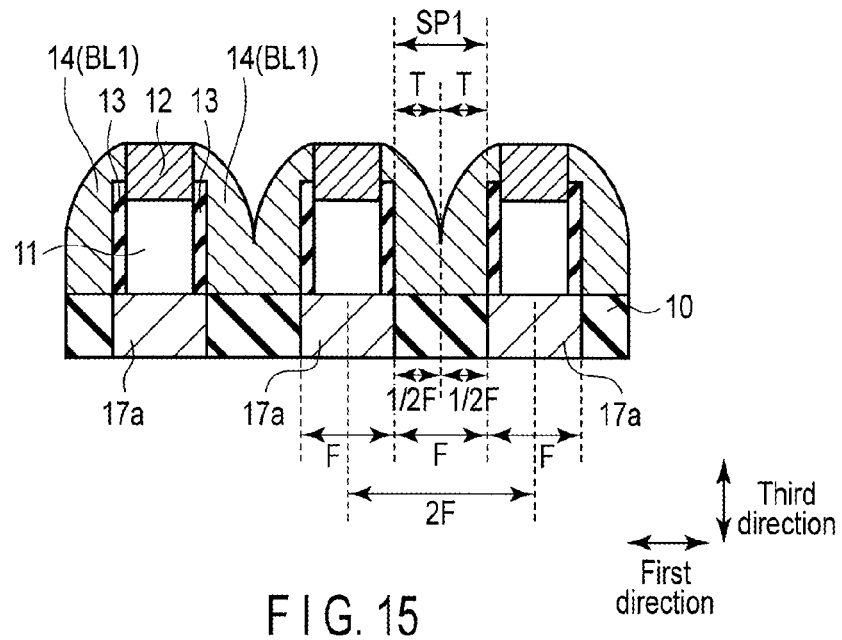
FIG. 15 is a sectional view along line XV-XV in FIG. 14.
Figure 16:
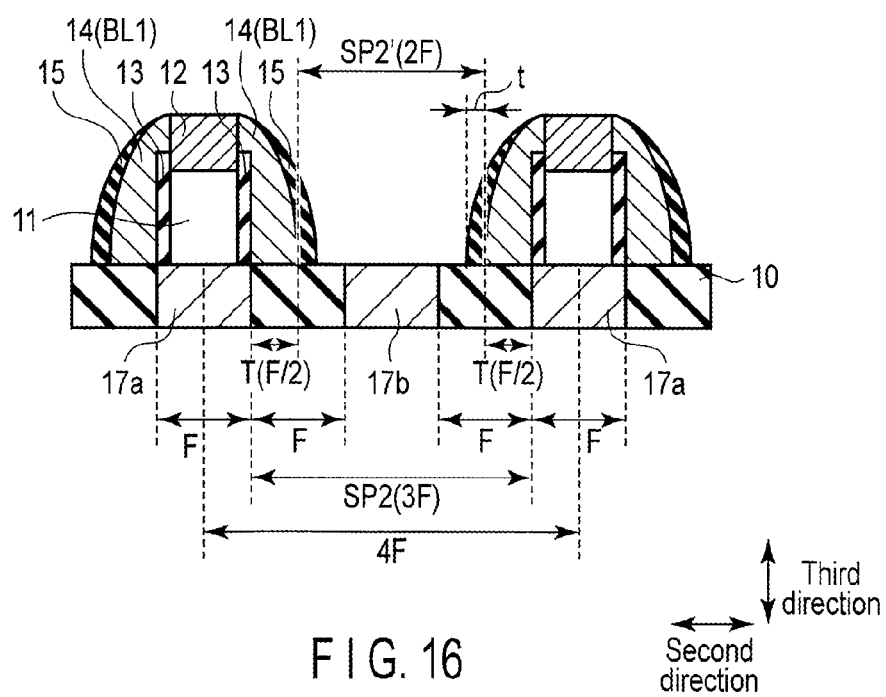
FIG. 16 is a sectional view along line XVI-XVI in FIG. 14.

Then, as illustrated in FIGS. 14 to 16, the second insulating layer 15 is formed as the sidewall insulating layer on the sidewall of the second conductive layer 14. The second insulating layer 15 that covers the resistance change element R and the second conductive layer 14 is formed by methods, such as the CVD method, the PVD method, and the ALD method. The second insulating layer 15 is etched by the RIE to leave the second insulating layer 15 as the first bit line BL1 only on the sidewall of the second conductive layer 14.

At this point, it is necessary that the second insulating layer 15 be formed such that the second space SP2 is not filled with the second insulating layer 15. For example, when the second space SP2' is 2F after the second conductive layer 14 is formed, the thickness t in the second direction of the second insulating layer 15 is set less than F. Therefore, the second space SP2 (SP2') is still ensured between the first bit lines BL1.

Then, as illustrated in FIGS. 17 to 19, the second space SP2 is filled with the third conductive layer 16. Therefore, the second bit line BL2 extending in the first direction is formed in the self-aligned manner with respect to the first bit line BL1 and the contact plugs 17b.

For example, the third conductive layer 16 can be formed by the damascene process. The third conductive layer 16 with which the second space SP2 is completely filled is deposited by methods, such as the CVD method, the PVD method, and the ALD method. Then the third conductive layer 16 is left only in the second space SP2 by a CMP process or an etching back process.

At this point, the second insulating layer 15 insulates the second conductive layer 14 that is of the first bit line BL1 from the third conductive layer 16 that is of the second bit line BL2 by exposing the upper surfaces of the first conductive layer 12 and the second insulating layer 15. For example, the upper surface of the third conductive layer 16 is set to a level lower than the upper surfaces of the first conductive layer 12 and the second insulating layer 15.

In the CMP process or the etching back process, through which the second bit line BL2 is formed, there is no trouble even if the material constituting the third conductive layer 16 remains partially in the recess existing on the upper surface of the second conductive layer 14 in FIG. 19.

The resistance change memory of the second structure example is completed through the steps.

Application Example

The first and second structure examples and the manufacturing method can be applied to general memories in which the resistance change element is used. An application example in which the first and second structure examples and the manufacturing method are applied to a resistance change memory including a 1T1R-type memory cell array in which one memory cell includes one resistance change element and one selection transistor.

Figure 20:
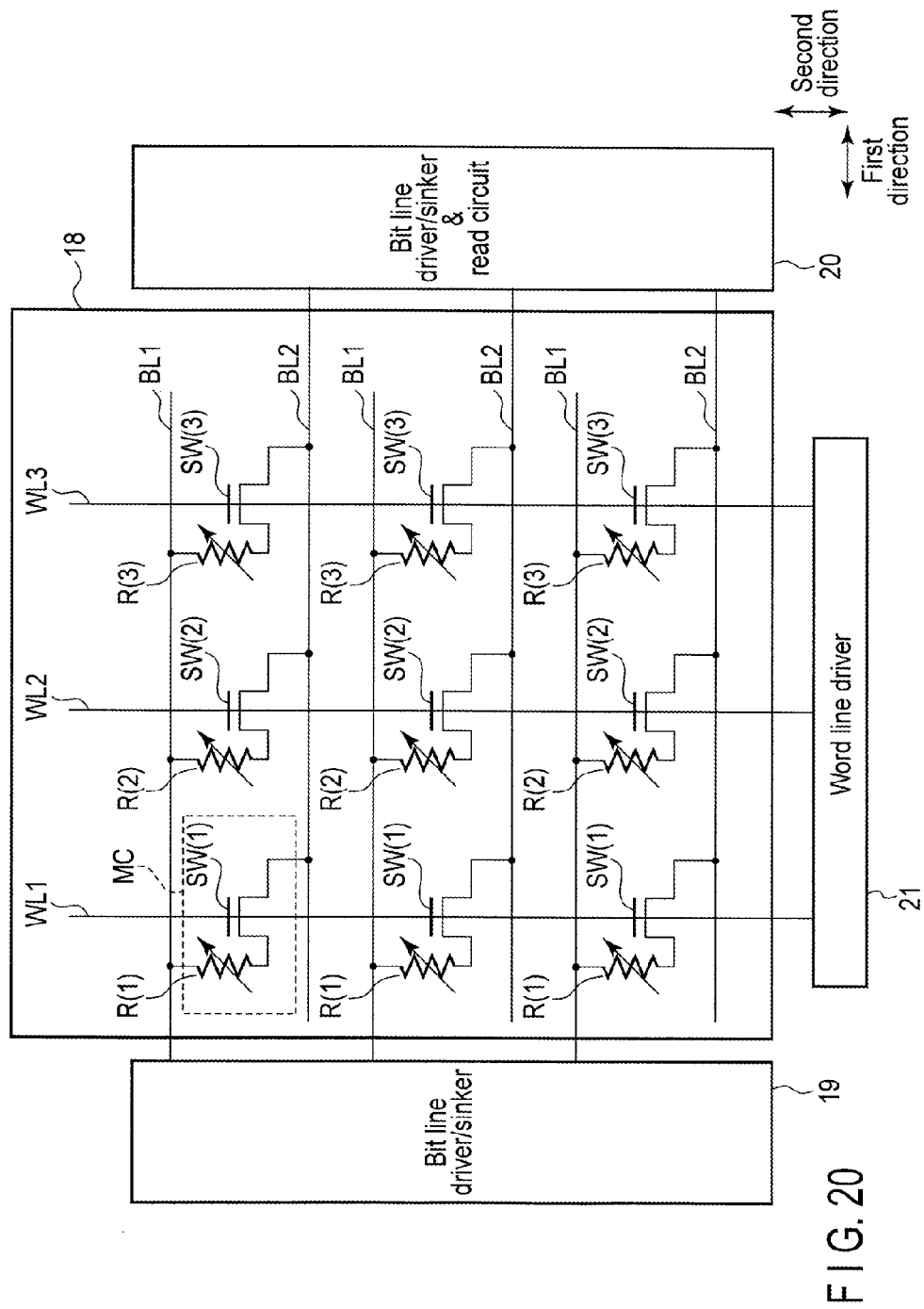
FIG. 20 is a circuit diagram illustrating a memory cell array as an application example.

FIG. 20 illustrates an equivalent circuit of the 1T1R-type memory cell array. A memory cell array 18 includes resistance change elements R(1) to R(3), selection transistors (FET) SW(1) to SW(3), first bit lines BL1, second bit lines BL2, and word lines WL1 to WL3.

One memory cell MC includes one resistance change element R(i) and one selection transistor SW(i), which are connected in series. Where i is one of 1 to 3.

One end (a side of the resistance change element R(i)) of the memory cell MC is connected to the first bit line BL1, and the other end (a side of the selection transistor SW(i)) of the memory cell MC is connected to the second bit line BL2.

The first bit line BL1 extends in the first direction, and one end of the first bit line BL1 is connected to a bit line driver/sinker 19 that is used to read and write the data. The second bit line BL2 extends in the first direction, and one end of the second bit line BL2 is connected to a bit line driver/sinker & read circuit 20.

Alternatively, the first bit line BL1 may be connected to the bit line driver/sinker & read circuit 20 while the second bit line BL2 is connected to the bit line driver/sinker 19.

The positions of the bit line driver/sinker 19 and the bit line driver/sinker & read circuit 20 may be reversed, or the bit line driver/sinker 19 and the bit line driver/sinker & read circuit 20 may be disposed in the same position.

For example, a gate electrode of the selection transistor SW(i) extends as the word line WL(i) in the second direction, one end of the gate electrode is connected to a word line driver 21 that drives the word line WL(i) in reading and writing the data.

Figure 21:
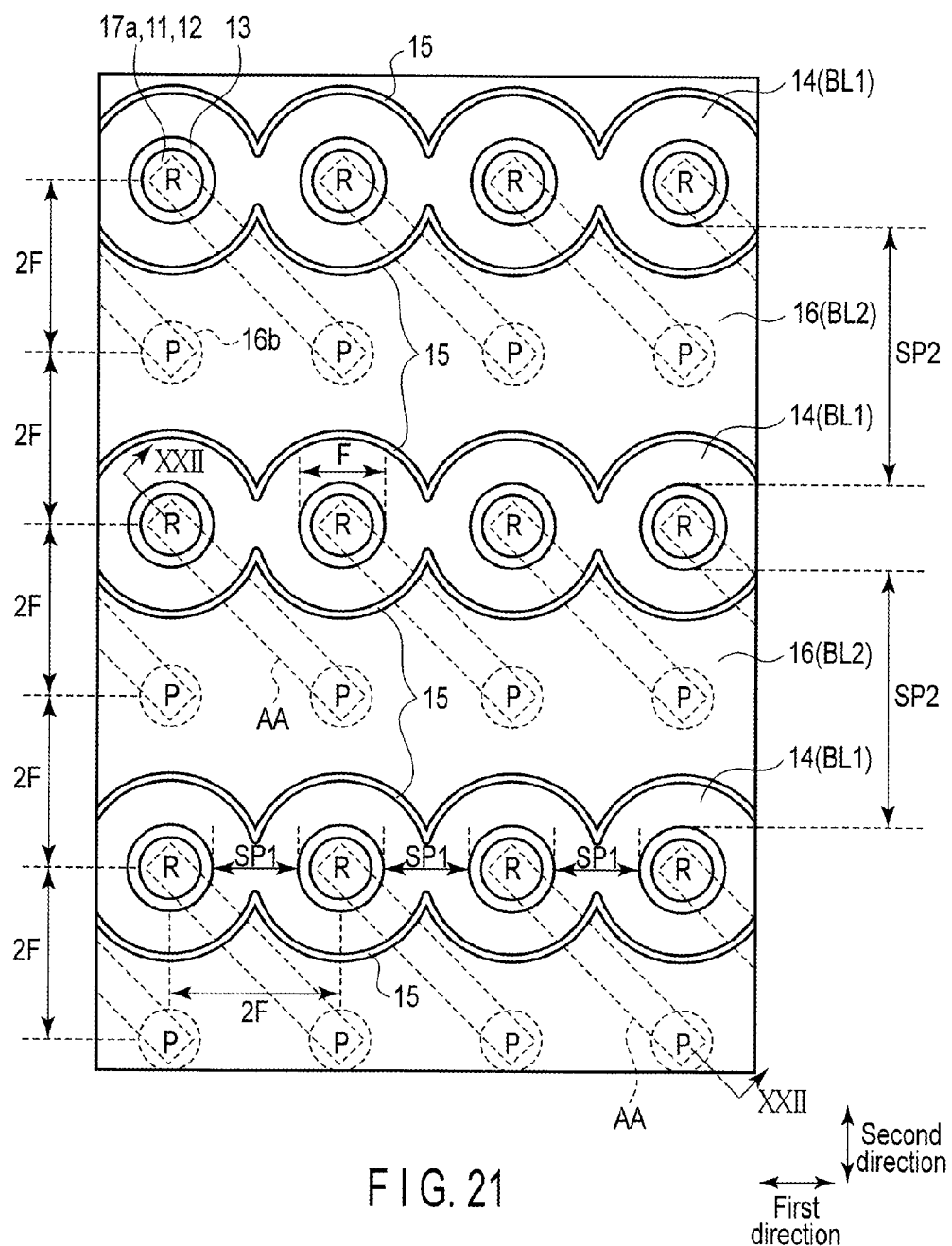
FIG. 21 is a plan view illustrating a structure example of the memory cell array in FIG. 20.
Figure 23:
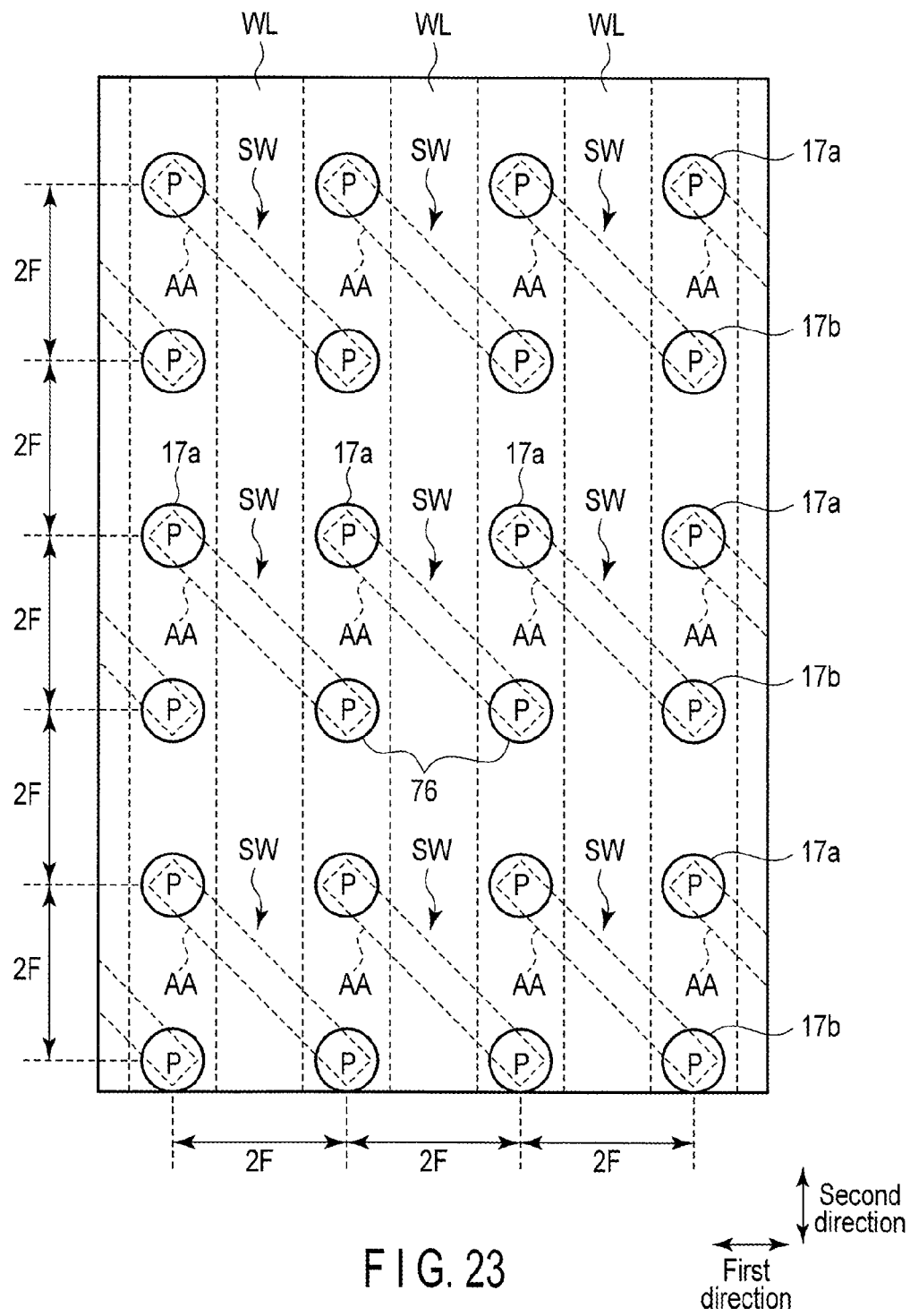
FIG. 23 is a plan view illustrating a layout of an active area.

FIG. 21 illustrates a structure example of the memory cell array in FIG. 20. FIG. 22 is a sectional view along line XXII-XXII in FIG. 21. FIG. 23 illustrates a layout of the selection transistor including an active area AA in the plan view in FIG. 21.

For example, a semiconductor substrate 31 is a silicon substrate. For example, an element isolation insulating layer 32 is a silicon oxide layer having an STI (Shallow Trench Isolation) structure. The active area AA is surrounded by the element isolation insulating layer 32. The active area AA extends in a direction (for example, a direction of 45°) oblique to the first and second directions.

In the application example, the active areas AA are arrayed, and an FET is disposed as one selection transistor SW in one active area AA.

The selection transistor SW includes a first source/drain layer 33a, a second source/drain layer 33b, and a gate electrode 34 on a channel between the first source/drain layer 33a and the second source/drain layer 33b. The gate electrode 34 acts as the word line WL extending in the second direction.

In the application example, the selection transistor SW is formed in a planar manner. However, the selection transistor SW is not limited to the planar manner. For example, the selection transistor SW may be a fin FET in which the upper surface and the side surface of the fin-type active area AA are covered with the gate electrode.

An insulating layer 10 is formed on the semiconductor substrate 31 so as to cover the selection transistor SW. The insulating layer 10 corresponds to the underlayer 10 of the first and second structure examples. Contact plugs 17a and 17b are formed in the insulating layer 10.

The contact plug 17a is connected to a first source/drain layer 33a of the selection transistor SW, and the contact plug 17b is connected to a second source/drain layer 33b of the selection transistor SW.

The resistance change element R is disposed immediately above the contact plug 17a. The resistance change element R includes a variable resistance layer 11, a first conductive layer 12, and a first insulating layer 13. A second conductive layer 14 as the first bit line BL1 and a second insulating layer 15 are disposed on the sidewall of the resistance change element R.

The second bit line BL2 is disposed immediately above the contact plug 17b.

Because the configurations of the resistance change element R, the second conductive layer 14 (the first bit line BL1), the third conductive layer 16 (the second bit line BL2), and the second insulating layer 15 are identical to those of the first and second structure examples, the detailed description is omitted.

Figure 24:
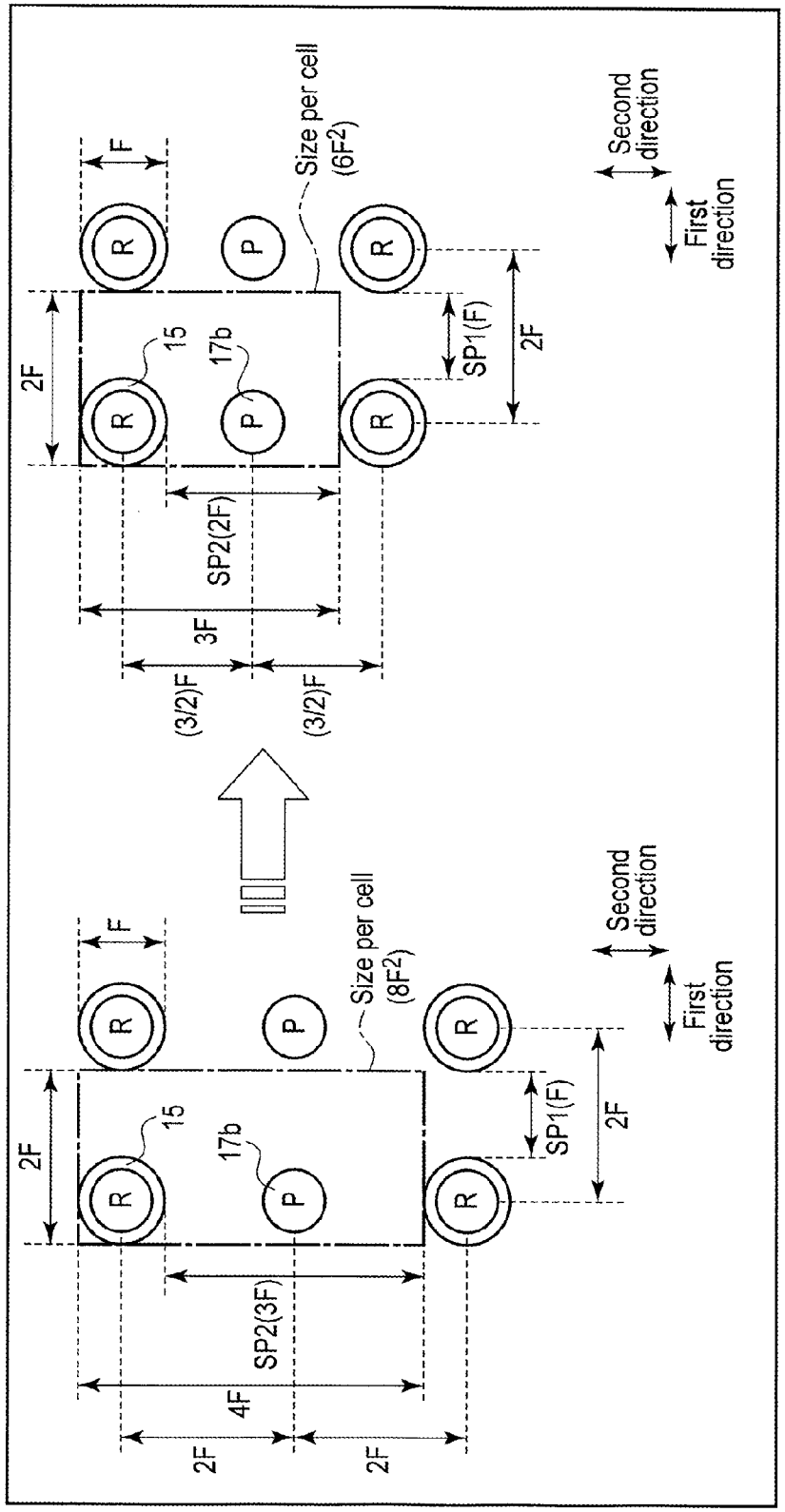
FIG. 24 is a plan view illustrating an effect related to microfabrication of the memory cell.

In the case of the 1T1R-type memory cell, as illustrated in FIG. 24, generally the size per memory cell becomes $8F^2$ ($=2F \times 4F$).

That is, the resistance change elements R are arrayed with the pitch 2F in the first direction and with the pitch 4F in the second direction.

On the other hand, according to the 1T1R-type memory cell of the application example, the first and second bit lines BL1 and BL2 are formed in the self-aligned manner, so that the pitch in the second direction of the resistance change elements R is smaller than 4F.

In principle, the pitch in the second direction of the resistance change elements R can be set to a range greater than 3F and less than or equal to 4F. At this point, it is assumed that F is the size of the resistance change element R, that F/2 is the thickness (the first and second directions) T of the second conductive layer 14, and that F is the size of the contact plug 17b.

In this case, the pitch in the second direction of the resistance change elements R becomes (size of resistance change element=F)+(size of contact plug 17b=F)+(double thickness T of second conductive layer 14=F)+(thickness of second insulating layer 15).

In other words, as shown in FIG. 24, assuming that the space SP1 between the resistance change elements in the first direction is F, the space SP2 between the resistance change elements in the second direction is greater than 2F, and is equal to or less than 3F.

That is, the pitch in the second direction of the resistance change elements R can be reduced to a value close to 3F without limit. Accordingly, the size per memory cell can be brought close to $6F^2$ ($=2F \times 3F$) without limit.

As described above, according to the 1T1R-type memory cell array of the application example, the reduction of the manufacturing cost and the microfabrication of the memory cell can simultaneously be achieved by forming the first and second bit lines BL1 and BL2 in the self-aligned manner.

The 1T1R-type memory cell array is used in an MRAM (Magnetic Random Access Memory) in which the resistance change element R is an MTJ (Magnetic Tunnel Junction) element, an ReRAM (Resistive Random Access Memory) in which the resistance value varies according to a physical property of the resistance change element R, and an ion memory.

CONCLUSION

According to the embodiment, the microfabrication of the memory cell and the reduction of the manufacturing cost can be achieved in the resistance change memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   resistance change elements arrayed with a first space in a first direction and with a second space wider than the first space in a second direction orthogonal to the first direction, each of the resistance change elements including a variable resistance layer, a first conductive layer on the variable resistance layer, and a first insulating layer covering a sidewall of at least the variable resistance layer;
   second conductive layers disposed on sidewalls of the first insulating layer and the first conductive layer of resistance change elements respectively, each of the second conductive layers having a width greater than or equal to a half of the first space in the first direction and having a width less than a half of the second space in the second direction, the second conductive layers functioning as a first bit line extending in the first direction by connecting the resistance change elements arrayed in the first direction; a second insulating layer disposed on a sidewall of the first bit line, and not filling the second space; and
   a third conductive layer functioning as a second bit line extending in the first direction by filling the second space.

2. The memory of claim 1, further comprising:
   contact plugs disposed with a constant pitch in the first direction in the second space,
   wherein a width in the second direction of the second conductive layer has a value in which the second conductive layer is separated from the contact plugs, and the third conductive layer connects the contact plugs.

3. The memory of claim 2, further comprising:
   active areas disposed in an array manner, each extending in a direction oblique to the first and second directions; and FETs disposed in the active areas respectively,
   wherein each of the FETs includes a gate electrode as a word line extending in the second direction, a first source/drain layer connected to one of the resistance change elements, and a second source/drain layer connected to one of the contact plugs.

4. The memory of claim 3, further comprising:
   a contact plug disposed between the first source/drain layer and one of the resistance change elements.

5. The memory of claim 1,
   wherein, the space SP1 between the resistance change elements in the first direction is F, the space SP2 between the resistance change elements in the second direction is greater than 2F, and is equal to or less than 3F.

6. The memory of claim 1,
   wherein a side surface in the second direction of the first bit line has a shape connected convex curves.

7. The memory of claim 1,
   wherein a side surface in the second direction of the second bit line has a shape connected concave curves.

8. The memory of claim 1,
   wherein an upper surface of the second bit line is located lower than an upper surface of the first conductive layer.

9. The memory of claim 1,
   wherein each of the resistance change elements is a magnetoresistive element.

10. The memory of claim 1,
    wherein the first conductive layer is a hard mask layer.

11. A method of manufacturing the memory of claim 1, the method comprising:
    patterning the variable resistance layer by using the first conductive layer as a mask;
    forming the first insulating layer as a sidewall insulating layer on a sidewall of at least the variable resistance layer;
    forming the first bit line with a self-alignment to the resistance change elements by forming the second conductive layer as a sidewall conductive layer on sidewalls of the first insulating layer and the first conductive layer;
    forming the second insulating layer as a sidewall insulating layer on a sidewall of the second conductive layer; and
    forming the second bit line with a self-alignment to the first bit line by filling the second space with the third conductive layer.

12. The method of claim 11, further comprising:
    forming contact plugs with a constant pitch in the first direction in the second space,
    wherein a width in the second direction of the second conductive layer has a value in which the second conductive layer is separated from the contact plugs, and the third conductive layer connects the contact plugs.

13. The method of claim 12, further comprising:
    forming active areas disposed in an array manner, each extending in a direction oblique to the first and second directions; and forming FETs in the active areas respectively,
    wherein each of the FETs includes a gate electrode as a word line extending in the second direction, a first source/drain layer connected to one of the resistance change elements, and a second source/drain layer connected to one of the contact plugs.

14. The method of claim 13, further comprising:
    forming a contact plug disposed between the first source/drain layer and one of the resistance change elements.

15. The method of claim 11,
    wherein, the space SP1 between the resistance change elements in the first direction is F, the space SP2 between the resistance change elements in the second direction is greater than 2F, and is equal to or less than 3F.

16. The method of claim 11,
    wherein a side surface in the second direction of the first bit line has a shape connected convex curves.

17. The method of claim 11,
    wherein a side surface in the second direction of the second bit line has a shape connected concave curves.

18. The method of claim 11,
    wherein an upper surface of the second bit line is located lower than an upper surface of the first conductive layer.

19. The method of claim 11,
    wherein each of the resistance change elements is a magnetoresistive element.

20. The method of claim 11,
    wherein the first conductive layer is a hard mask layer.

* * * * *